United States Patent
Kim et al.

(10) Patent No.: US 7,715,458 B2
(45) Date of Patent: May 11, 2010

(54) SEMICONDUCTOR OPTICAL DEVICES, SYSTEMS AND METHODS OF MANUFACTURING THE SAME

(75) Inventors: Jun-youn Kim, Suwon-si (KR); Kyoung-ho Ha, Seoul (KR); Soo-haeng Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 363 days.

(21) Appl. No.: 11/980,424

(22) Filed: Oct. 31, 2007

(65) Prior Publication Data

US 2008/0175294 A1   Jul. 24, 2008

(30) Foreign Application Priority Data

Jan. 18, 2007   (KR) .................. 10-2007-0005814

(51) Int. Cl.
  *H01S 5/20*   (2006.01)
  *H01L 31/00*  (2006.01)
  *H01L 21/00*  (2006.01)

(52) U.S. Cl. .............. 372/50.11; 257/14; 257/E33.008; 257/E33.023; 438/32

(58) Field of Classification Search ............... 372/50.11; 257/14, E33.008, E33.023; 438/32
See application file for complete search history.

(56) References Cited

U.S. PATENT DOCUMENTS

| 5,493,577 | A * | 2/1996 | Choquette et al. ....... 372/46.013 |
| 6,545,340 | B1 * | 4/2003 | Higgs et al. ................. 257/565 |
| 2004/0228564 | A1 * | 11/2004 | Gunn et al. ..................... 385/1 |
| 2006/0119930 | A1 * | 6/2006 | Jones ......................... 359/333 |
| 2007/0170417 | A1 * | 7/2007 | Bowers ........................ 257/14 |

* cited by examiner

*Primary Examiner*—Evan Pert
(74) *Attorney, Agent, or Firm*—Harness, Dickey & Pierce, P.L.C.

(57) ABSTRACT

A semiconductor optical device includes a silicon substrate and a Group III-V semiconductor gain layer. The Group III-V semiconductor gain layer is formed on the silicon substrate. The silicon substrate or the Group III-V semiconductor gain layer has a dispersion Bragg grating formed therein. In a method of manufacturing a semiconductor optical device, a Group III-V semiconductor gain layer is formed on a silicon substrate. A dispersion Bragg grating is formed on the silicon substrate or the Group III-V semiconductor gain layer.

29 Claims, 9 Drawing Sheets

SEMICONDUCTOR OPTICAL DEVICES, SYSTEMS AND METHODS OF MANUFACTURING THE SAME

PRIORITY STATEMENT

This non-provisional U.S. patent application claims priority under 35 U.S.C. §119 to Korean Patent Application No. 10-2007-0005814, filed on Jan. 18, 2007 in the Korean Intellectual Property Office, the entire contents of which is incorporated herein by reference.

BACKGROUND

Description of the Related Art

As optical communication devices become more developed, the amount of information transmitted and data transmission speeds increase. The speed of computers has also increased, while the size of transistors has decreased. As the size of transistors decreases, the time optical signals wander about in metal lines may be longer than the time required to switch the transistor. This time difference may result in an interconnection delay. Conventionally, opto-electric integrated circuits (OEICs) may be used to reduce this interconnection delay. In an OEIC, a heterojunction method in which signals are processed using a compound semiconductor in a silicon-based driving unit may be used. However, utilizing heterojunction OEIC may increase manufacturing time and/or costs.

A silicon light source may be produced by heterojunctioning a compound semiconductor and silicon on a wafer to amplify laser light from silicon. However, in this conventional method, the laser has a relatively high serial resistance on a junction surface of the compound semiconductor and the silicon. Furthermore, spectrums of the laser may oscillate in a multi-mode, and thus, the laser may not be applicable to a wavelength division multiplexing (WMD) mode.

FIG. 1 illustrates a semiconductor optical device in which a compound semiconductor gain layer 20 is joined to a silicon-on-insulator (SOI) structure 10. A silicon layer formed on the SOI structure 10 may be etched to produce a Si rib waveguide. An AlGaInAs compound may be used as a gain medium of the semiconductor gain layer 20, and a multi-quantum well (MQW) layer may be formed on an InP layer. An InP cladding layer may be formed on the MQW layer. A lens 25 may be disposed between a pump laser 30 and the semiconductor optical device. The lens 25 may collimate pumping beams emitted from the pump laser 30.

An active layer having a MQW structure may be excited by a pumping beam having a first wavelength $\lambda_1$ and emit a beam having a second wavelength $\lambda_2$. The pump laser 30 may excite the active layer using the pumping beam having the first wavelength $\lambda_1$, which may be shorter than the second wavelength $\lambda_2$.

When the pumping beam is incident on the active layer, the active layer may become excited and emit the beam having the second wavelength $\lambda_2$. The emitted beam may be incident on the rib waveguide. The beam may resonate on both mirror surfaces of the rib waveguide and be output to the outside of the rib waveguide.

A quantum well layer may include a plurality of quantum wells (QWs), a plurality of barrier layers disposed between the quantum wells, and a plurality of strain compensation layers sequentially stacked on upper and lower surfaces of the QWs. The strain compensation layers may suppress structural defects due to strains of the QW layers by gradually mitigating strains of the QW layers. The active layer may be excited by absorbing pumping beams to emit beams.

When the above-described structure is applied to an electric driving mode, a semiconductor gain layer and a SOI may be joined, and thus, a relatively high resistance may exist on the junction surface. Accordingly, the optical efficiency of a semiconductor optical device having the above junction structure may be relatively low. Also, because light generated in the above semiconductor optical device has spectrums in a multi-mode, the semiconductor optical device may not be used in a WDM mode.

SUMMARY

Example embodiments relate to optical devices, systems and methods of manufacturing the same, for example, silicon-based semiconductor optical devices oscillating in a single mode and having reduced serial resistance and methods of manufacturing the same.

Example embodiments may also provide a silicon-based semiconductor optical device with a relatively low or reduced resistance by growing a semiconductor gain layer with a lattice constant similar or substantially similar to silicon on a silicon-on-insulator (SOI), and methods of manufacturing the same.

According to at least one example embodiment, a semiconductor optical device may include a silicon substrate and a Group III-V semiconductor gain layer formed on the silicon substrate. A dispersion Bragg grating may be formed in the silicon substrate and/or the Group III-V semiconductor gain layer.

According to at least some example embodiments, the Group III-V semiconductor gain layer may include a gain medium having the same or substantially the same lattice constant as the silicon substrate. The gain medium may include Ga(In)NAsP, GaNAsP or the like. The dispersion Bragg grating may be formed using a holography method, a lithography method or the like. The silicon substrate may include a first silicon layer, an insulating layer and/or a second silicon layer. A plurality of silicon dioxide layers may be formed on the second silicon layer and a waveguide may be formed between the silicon dioxide layers. The silicon dioxide layers may be formed using an ion injection method, thermal oxidization or the like. According to at least some example embodiments, the dispersion Bragg grating may be formed on a top surface and/or a lateral side of the waveguide. The dispersion Bragg grating may be formed discontinuously.

At least one other example embodiment provides a method of manufacturing a semiconductor optical device. According to at least this example embodiment, a Group III-V semiconductor gain layer may be grown on a silicon substrate. A dispersion Bragg grating may be formed on the silicon substrate and/or the semiconductor gain layer.

At least one other example embodiment provides wavelength division multiplexing (WDM) system including a semiconductor optical device and a plurality of optical modulators. The semiconductor optical device may include a silicon substrate and a Group III-V semiconductor gain layer formed on the silicon substrate. The silicon substrate may include a plurality of rib waveguides coupled to a corresponding one of the plurality of optical modulators. Each of the plurality of rib waveguides may include a Bragg grating formed therein. The at least one Group III-V semiconductor gain layer may include a plurality of Group III-V semiconductor gain layers formed on the silicon substrate. Each of the plurality of semiconductor gain layers may correspond to one of the plurality of rib waveguides. Each Bragg grating may have a different period of grating.

BRIEF DESCRIPTION OF THE DRAWINGS

Example embodiments will become more apparent by describing in detail the example embodiments shown in the attached drawings in which.

DETAILED DESCRIPTION OF EXAMPLE EMBODIMENTS

Figure 1:
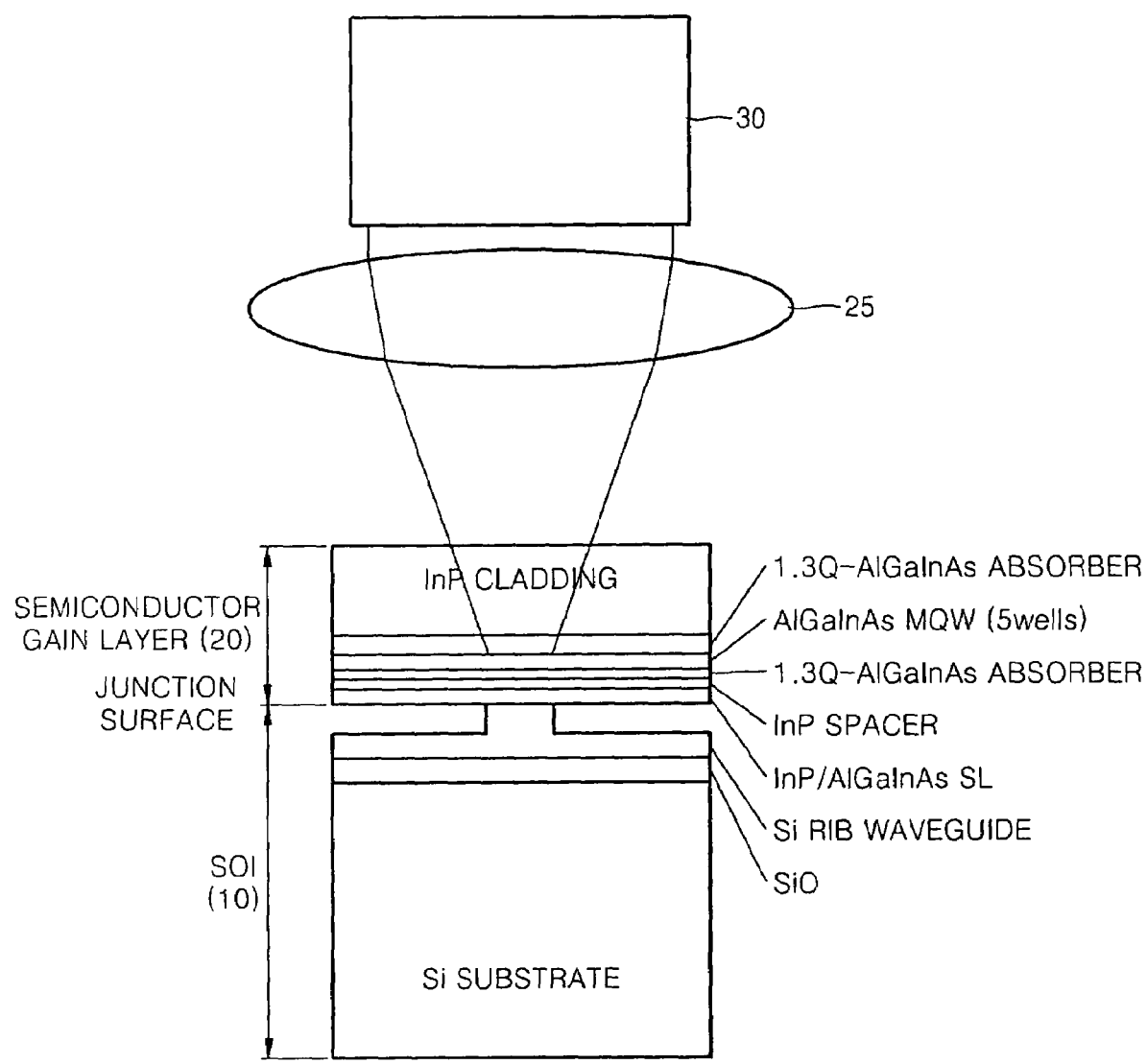
FIG. 1 illustrates a conventional semiconductor optical device.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between" versus "directly between," "adjacent," versus "directly adjacent," etc.).

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
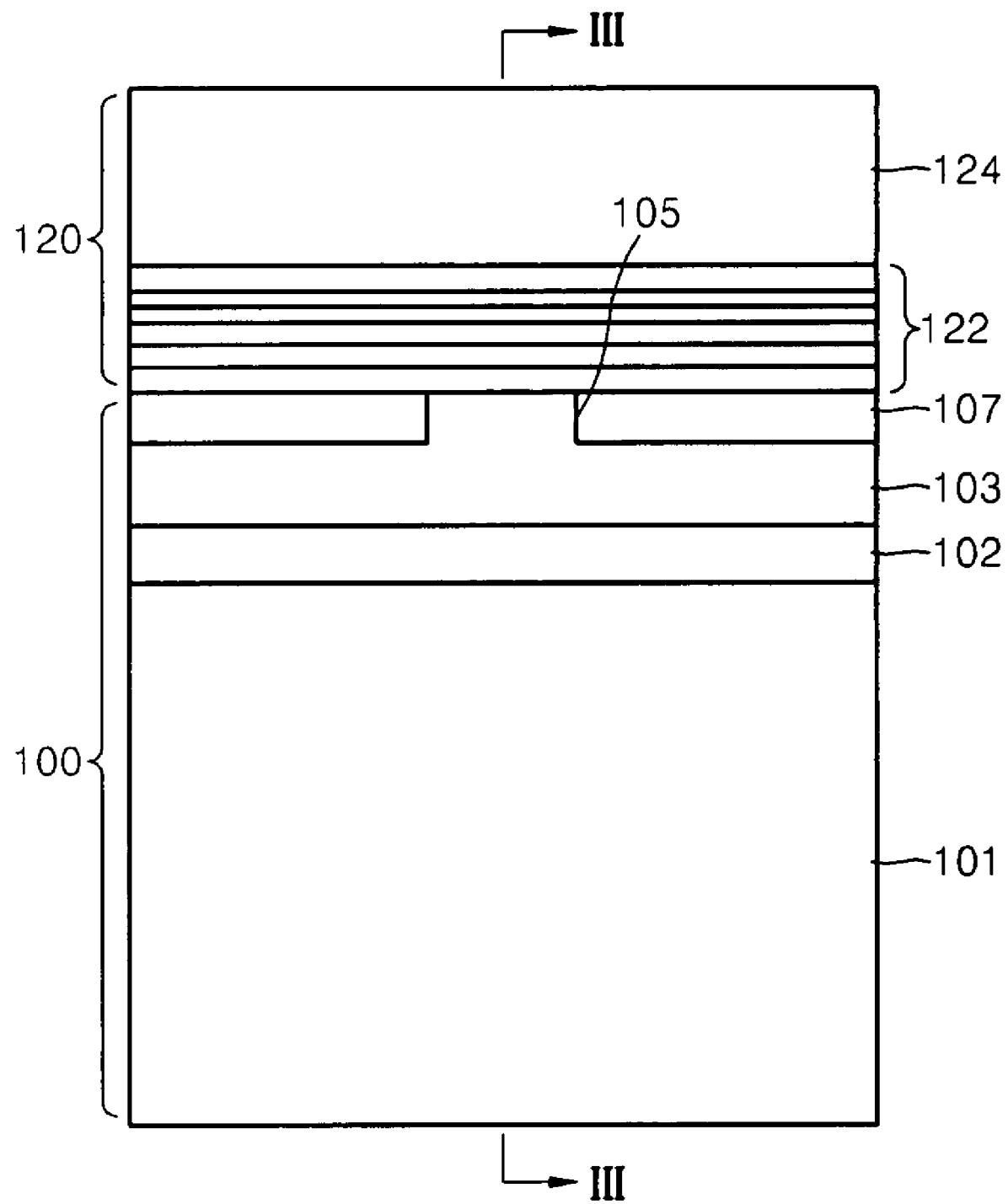
FIG. 2 illustrates a semiconductor optical device according to an example embodiment.

FIG. 2 illustrates a semiconductor optical device according to an example embodiment. Referring to FIG. 2, a semiconductor optical device may include a silicon substrate 100 and a Group III-V semiconductor gain layer 120 formed on the silicon substrate 100. A dispersion Bragg grating may be formed on the silicon substrate 100 and/or the semiconductor gain layer 120. The dispersion Bragg grating may have a structure in which a plurality of (e.g., two) semiconductor layers having different refractive indices may be alternately stacked to a thickness of about ¼n (n is a natural number) of a wavelength of oscillation beams. The structure of the Bragg grating may be the same or substantially the same as a structure in which two media having different refractive indices are alternately arranged, and light in a single mode may be lased using the dispersion Bragg grating. The dispersion Bragg grating will be described in more detail with reference to FIGS. 3A through 3C.

The silicon substrate 100 may include a silicon-on-insulator (SOI) wafer structure in which a first silicon layer 101, an insulating layer 102 and a second silicon layer 103 may be sequentially stacked. The semiconductor gain layer 120 may be formed of a gain medium having a lattice constant similar or substantially similar to silicon. For example, the semiconductor gain layer 120 may be formed of GaNAsP, Ga(In)NAsP or the like.

Figure 3A:
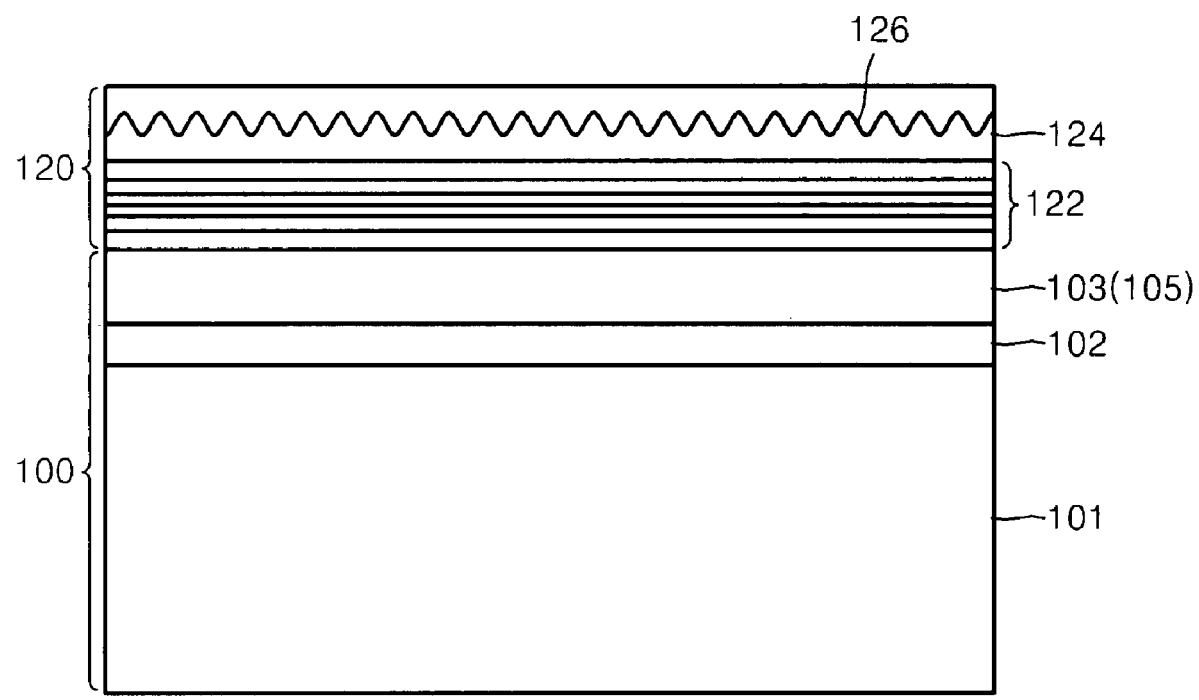
FIG. 3A is a cross-sectional view along a line III-III in FIG. 2.

FIG. 3A is a cross-sectional view cut along a line III-III in FIG. 2. FIG. 3A illustrates a dispersion Bragg grating 126 formed in the semiconductor gain layer 120 of an semiconductor optical device according to an example embodiment.

Referring to FIG. 3A, the semiconductor gain layer 120 may include an active layer 122 and a cladding layer 124 (e.g., an N-type cladding layer). The active layer 122 may include multiple quantum well layers. The dispersion Bragg grating 126 may be formed in the semiconductor gain layer 120. For example, the dispersion Bragg grating 126 may be formed on the-N type cladding layer 124. Alternatively, a P-type cladding layer may be formed in place of the N-type cladding layer 124 and the dispersion Bragg grating 126 may be formed on the P-type cladding layer. The dispersion Bragg grating 126 may be formed using holography, lithography or the like.

Figure 3B:
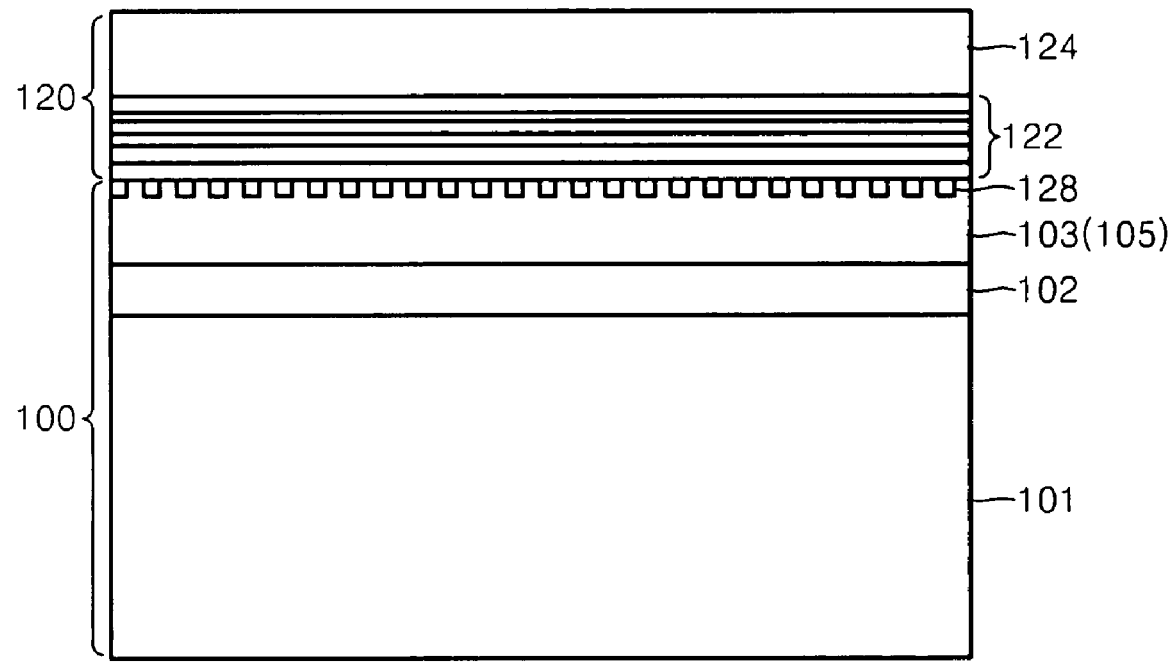
FIG. 3B illustrates a dispersion Bragg grating formed on a silicon substrate of a semiconductor optical device according to an example embodiment.

Alternatively, as illustrated in FIG. 3B, a dispersion Bragg grating 128 may be formed on the silicon substrate 100.

Referring to FIGS. 2 and 3B, the silicon substrate 100 may be formed of a SOI wafer including a first silicon layer 101, an insulating layer 102 and a second silicon layer 103. A silicon rib waveguide 105 and a silicon dioxide layer 107 may be formed in the second silicon layer 103. For example, the silicon dioxide layer 107 may be formed by injecting oxide ions into the second silicon layer 103, using a thermal oxidation process or the like. The silicon rib waveguide 105 may be formed in the silicon dioxide layer 107. The dispersion Bragg grating 128 may be formed on a top surface and/or a lateral side of the silicon rib waveguide 105. A Group III-V semiconductor material having a lattice constant similar, substantially similar, the same or substantially the same as that of silicon may be grown on the silicon dioxide layer 107 and the rib waveguide 105 to form the semiconductor gain layer 120.

In silicon-based semiconductor optical devices according to example embodiments, single mode light may oscillate through the dispersion Bragg grating. Such single mode oscillation may be required for wavelength division multiplexing (WDM) and/or add/drop multiplexing.

Figure 3C:
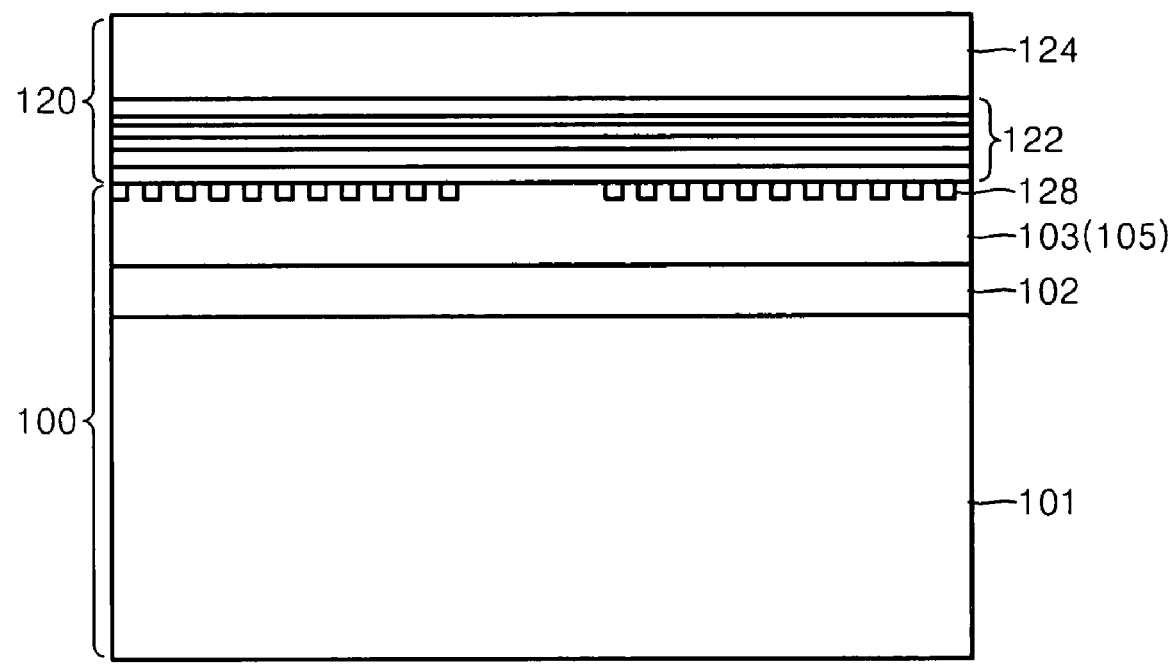
FIG. 3C illustrates a dispersion Bragg grating formed discontinuously on a silicon substrate of a semiconductor optical device according to an example embodiment.

Referring to FIG. 3C, a dispersion Bragg grating 128 may be formed discontinuously on a silicon substrate 101 of a semiconductor optical device according to an example embodiment.

Using the semiconductor optical device according to an example embodiment a wavelength division multiplexing (WDM) mode may be realized.

Figure 4:
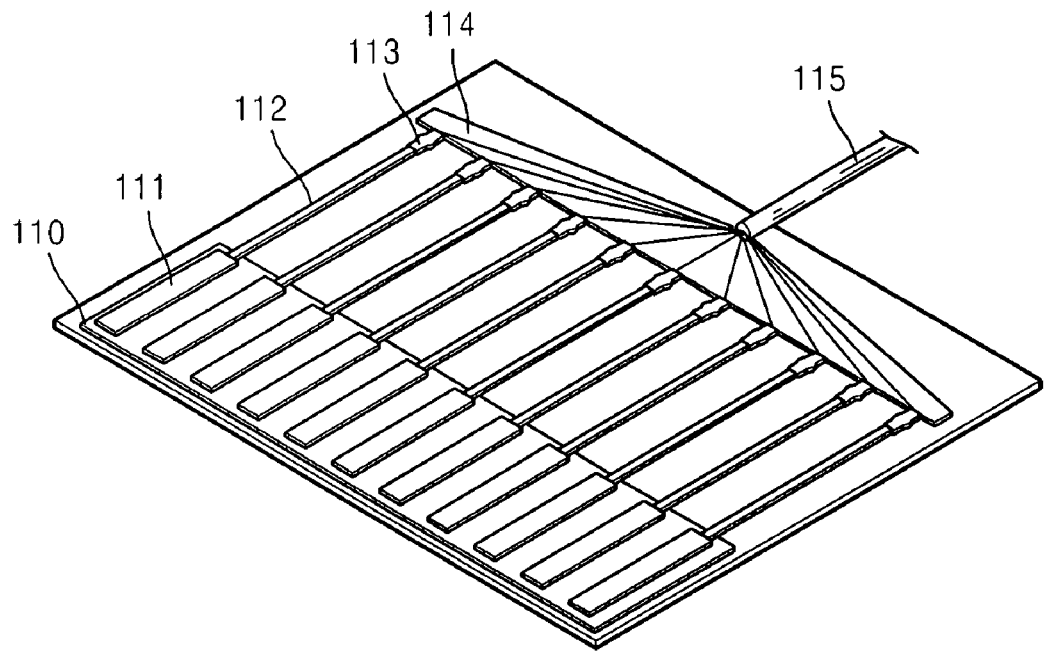
FIG. 4 illustrates a wavelength division multiplexing (WDM) system using a semiconductor optical device according to an example embodiment.

FIG. 4 illustrates a WDM system according to an example embodiment.

Referring to FIG. 4, a plurality of semiconductor gain layers 111 may be formed on a silicon substrate 110. A plurality of rib waveguides 112 extending from the space between the silicon substrate 110 and the semiconductor gain layers 111 may be coupled to optical modulators 113. Optical modulators 113 may be coupled to optical fibers or another waveguide 115 via multiplexers 114. The wavelength of laser light may be varied by varying periods of a Bragg grating 116 formed in each of the rib waveguides 112. Accordingly, a Group III-V semiconductor material may be grown to enable a WDM mode.

Figure 5:
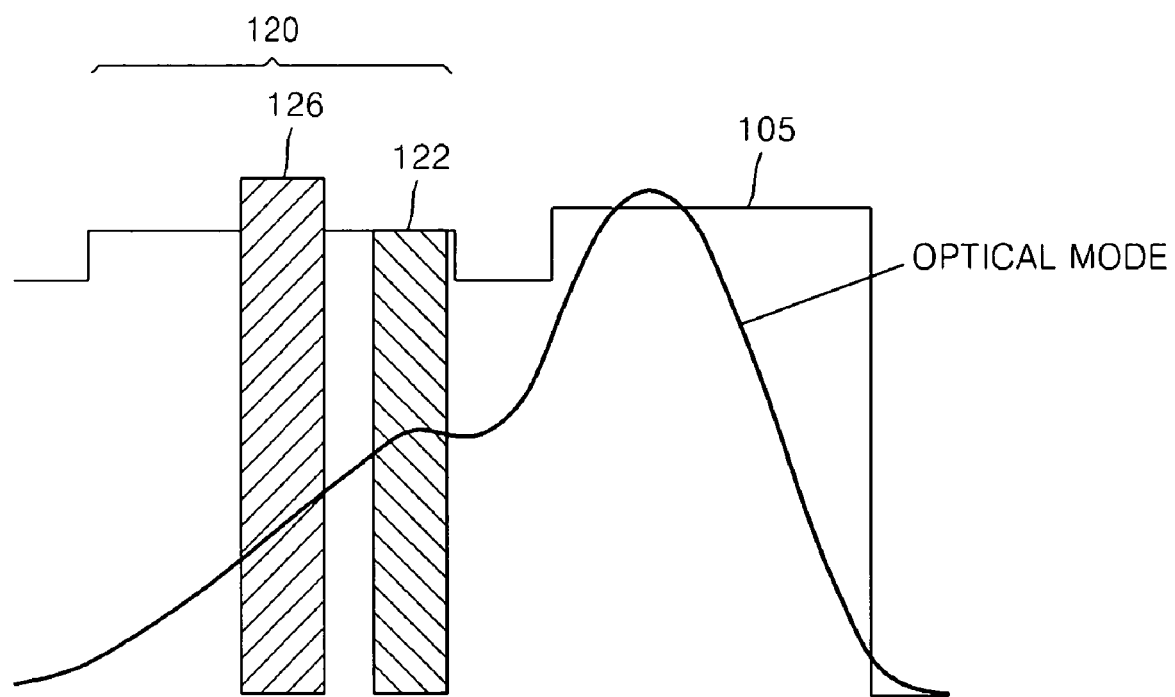
FIG. 5 illustrates an inner optical mode profile of a semiconductor optical device in which a dispersion Bragg grating is formed in a semiconductor gain layer according to an example embodiment.

FIG. 5 illustrates an example inner optical mode profile of a semiconductor optical device in which dispersion Bragg grating 126 is formed in semiconductor gain layers 120 according to an example embodiment.

Referring to FIG. 5, a confinement factor of a semiconductor gain medium may be less than or equal to about 5%, and a confinement factor of silicon may be greater than or equal to about 50%. In the dispersion Bragg grating 126, light having a wavelength corresponding to the grating period may experience constructive interference, and light having other wavelengths may be offset. In some cases, only light having a wavelength corresponding to the grating period may experience constructive interference.

According to example embodiments, the semiconductor gain layers may be grown such that the oscillation wavelength of the semiconductor gain medium may be about 1.55 µm, and the period of the dispersion Bragg grating may be formed to be about 1.55 µm.

A gain region may be formed of a material having a refractive index less than that of a rib waveguide such that an optical mode may be more easily confined on a silicon substrate, and such the rib waveguide may be formed on an SOI wafer. When the refractive index of the rib waveguide is greater than the gain region, an internal field may be coupled to the waveguide and light may be output from the silicon substrate. A semiconductor optical device according to at least some example embodiments may be an edge-type laser emitting light laterally.

The silicon substrate and the semiconductor gain layers may be joined together or the semiconductor gain layer may be grown on the silicon substrate. Semiconductor optical devices according to example embodiments may be optically and/or electrically excited. In the case of optical excitation, a pump laser may be used. In the case of electric excitation, electrodes may be used.

Figure 6A:
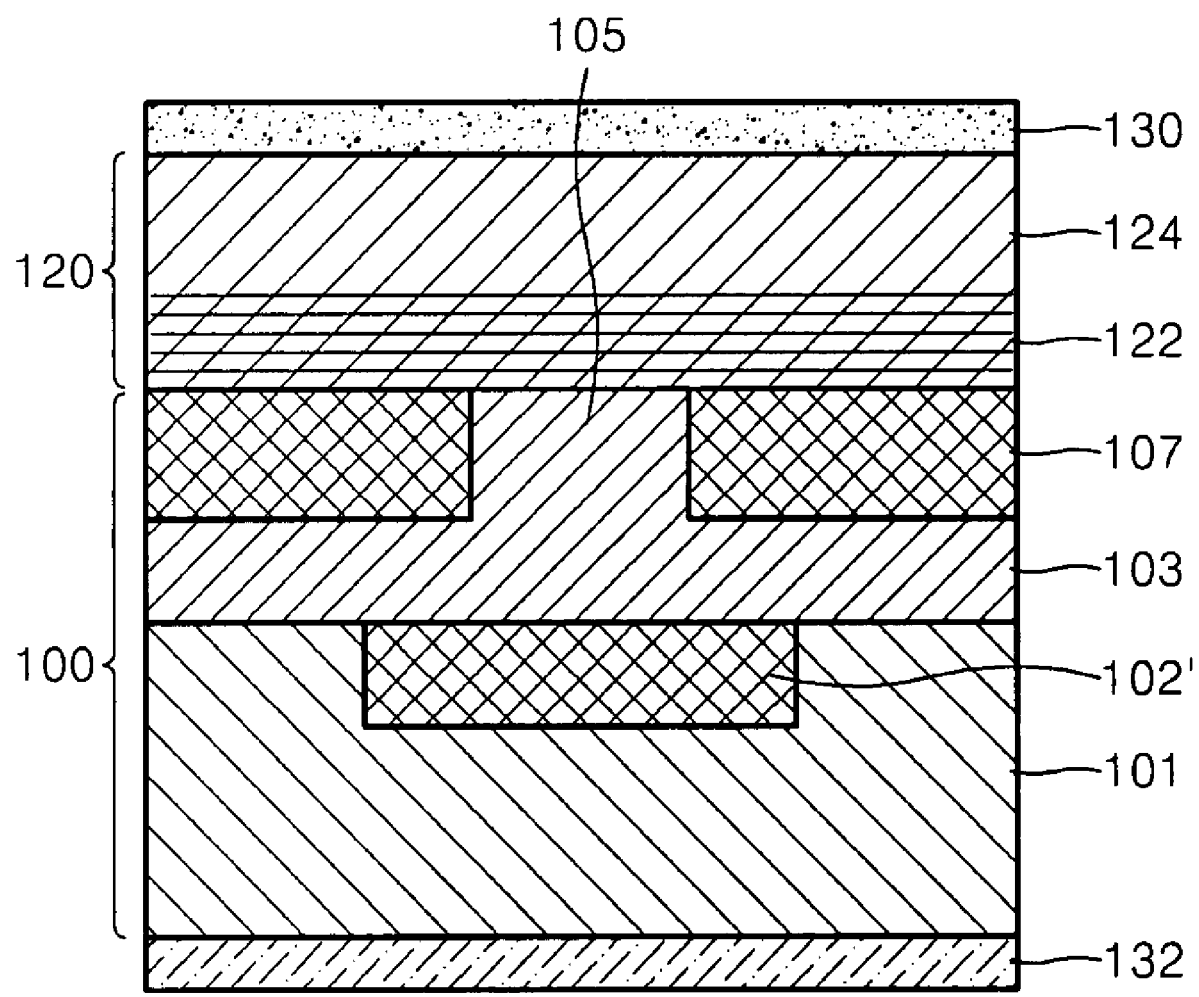
FIGS. 6A and 6B illustrates an arrangement of electrodes when electrically pumping a semiconductor optical device according to an example embodiment.
Figure 6B:
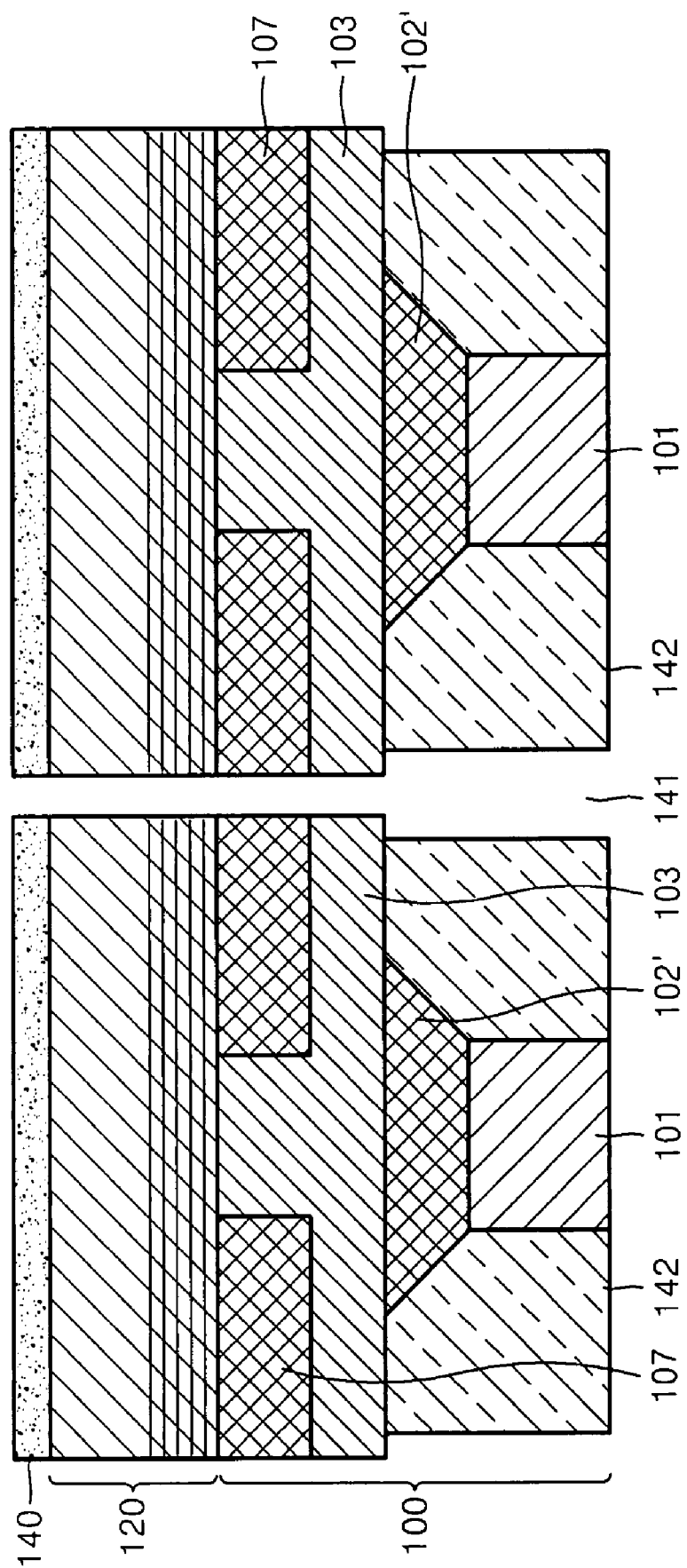

FIGS. 6A and 6B illustrate example arrangements of electrodes when electrically pumping a semiconductor optical device according to an example embodiment.

Referring to FIG. 6A, an electrode may be formed by forming a first metal layer (e.g., an N metal layer) 130 on the semiconductor gain layer 120, and a second metal layer (e.g., a P metal layer) 132 under the silicon substrate 100. Alternatively, the second metal layer 132 may be formed on the semiconductor gain layer 120 and the first metal layer 130 may be formed under the silicon substrate 100. In FIG. 6A, a patterned insulating layer 102' may be formed between a first silicon layer 101 and a second silicon layer 103. The insulating layer 102' may be a silicon dioxide layer.

Referring to FIG. 6B, a first metal layer (e.g., a P metal layer) 142 may be formed on each side of a first silicon layer 101 and an insulating layer 102'. Electrodes may be connected to each other through via holes 141. The insulating layer 102' may be formed of a silicon dioxide layer and may be patterned. The first metal layer 142 may be formed using an evaporation method, electro-plating method, a combination thereof or the like. Serial resistance may be reduced by connecting the electrodes through the via holes 141. Before forming via holes, electrons may move through thin layers, and thus, serial resistance may be relatively high.

Figure 7:
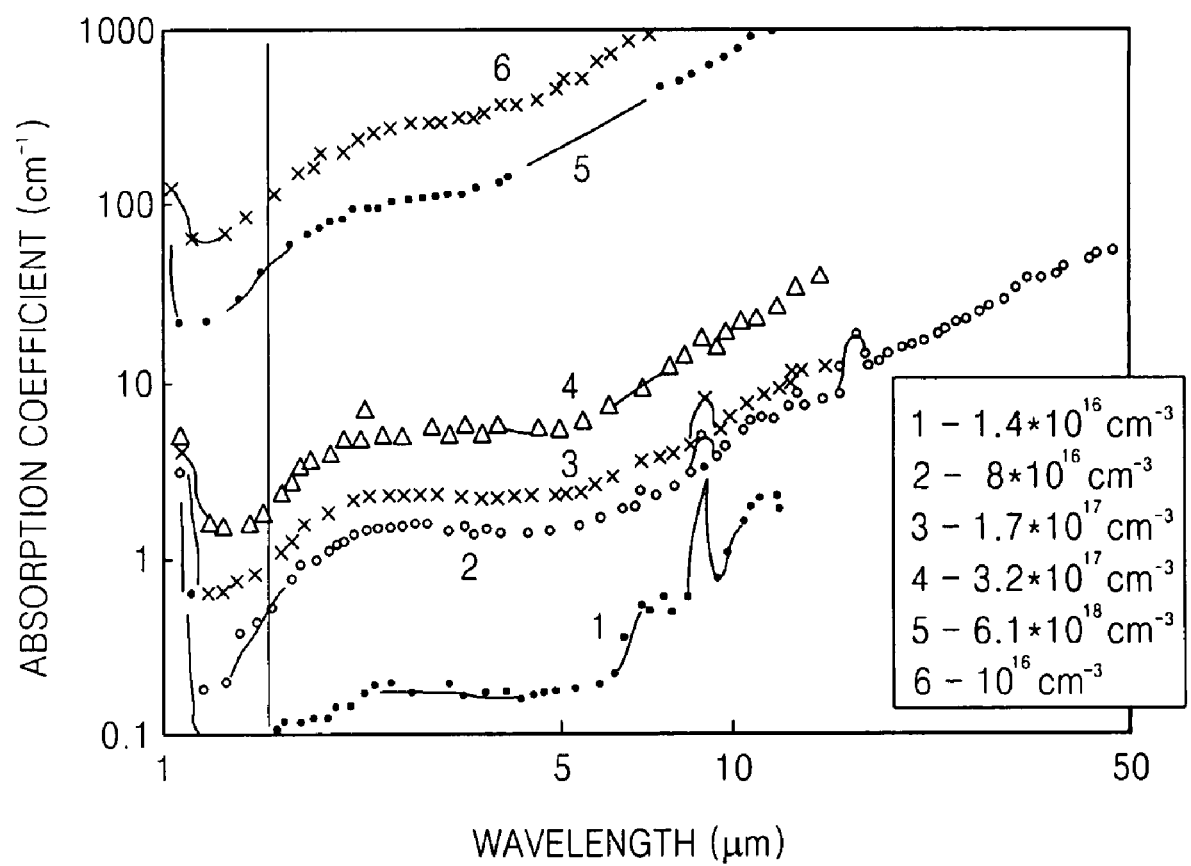
FIG. 7 is a graph showing absorption coefficients according to wavelengths for each doping levels with respect to a semiconductor device according to an example embodiment.

FIG. 7 is a graph showing example absorption coefficients according to wavelengths for doping levels in an example embodiment having the structure shown in FIG. 6B. Doping may reduce resistance when a current flows to a rib waveguide. In at least this example embodiment, because portions to be doped may be in the path of light, free carriers may be absorbed by the dopant. Absorption coefficients may vary according to doping levels. Referring to FIG. 7, absorption may be reduced (e.g., minimal) at a doping level No. 4 (e.g., about $3.2 \times 10^{17}$ cm$^{-3}$) used in semiconductor optical devices.

To reduce resistance at interfaces between the silicon substrate and the semiconductor gain layers, a material having the same or substantially the same lattice constant as silicon (e.g., GaNAsP or Ga(In)NAsP) may be grown on the silicon substrate.

Figure 8:
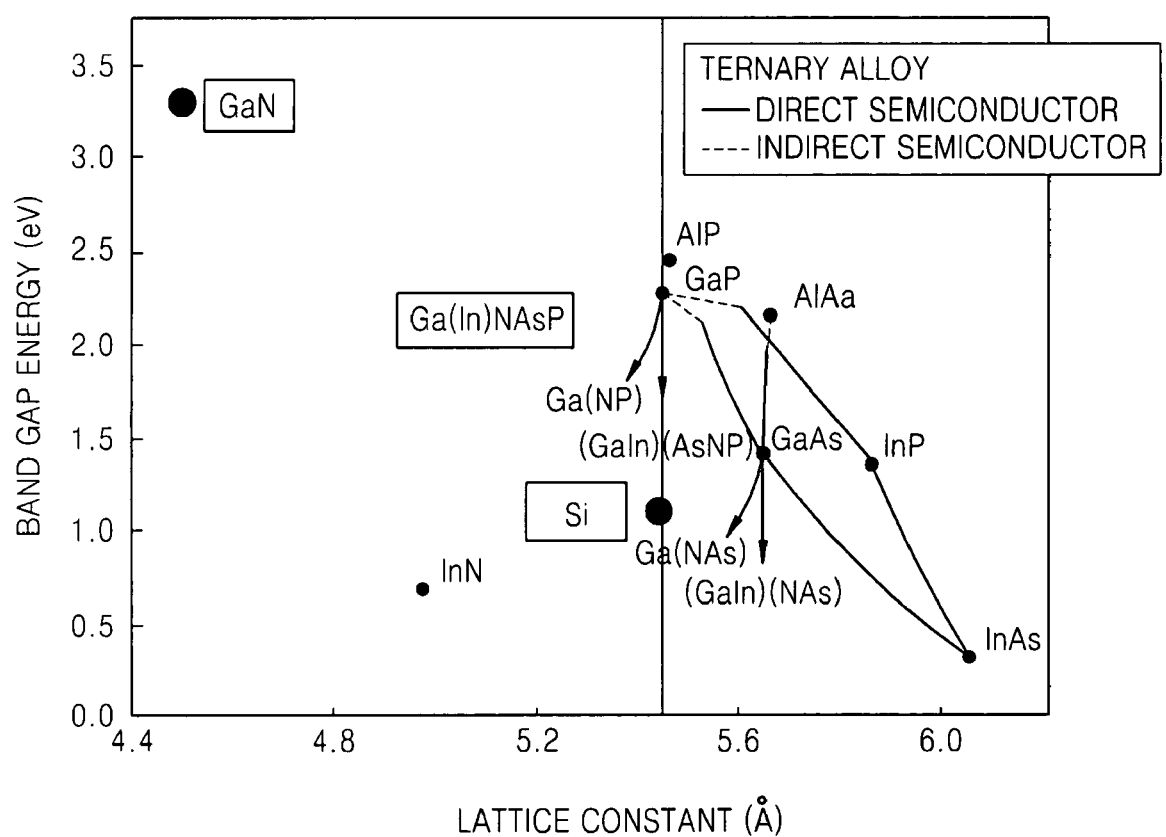
FIG. 8 shows band gap energy according to lattice constants with respect to a semiconductor device according to an example embodiment.

FIG. 8 is a graph showing example band gap energy according to lattice constants. In this example, GaNAsP or Ga(In)NAsP has a lattice constant that is the same as silicon. By using a material having the same or substantially the same lattice constant, resistance at the interfaces between the silicon substrate and the semiconductor gain layers may be reduced, and a semiconductor optical device having a relatively large surface may be manufactured.

A method of manufacturing a semiconductor optical device according to an example embodiment will be described with reference to the semiconductor optical device illustrated in FIG. 2.

Referring to FIG. 2, a Group III-V semiconductor gain layer 120 may be grown on a silicon substrate 100. The silicon substrate 100 may have a stack structure including a first silicon layer 101, an insulating layer 102 and a second silicon layer 103 stacked sequentially. One or more silicon dioxide layers 107 may be formed by injecting oxide ions partially into the second silicon layer 103, using thermal oxidation or the like. A rib waveguide 105 may be formed between neighboring or adjacent silicon dioxide layers 107.

A dispersion Bragg grating may be formed on a top surface and/or a lateral side of the rib waveguide 105. A semiconductor gain layer 120 may be formed on the silicon dioxide layers 107. A multiple well layer 122 may be grown as an active layer, and a cladding layer (e.g., an N type cladding layer) 124 may be grown on the multiple well layer 122. The multiple well layer 122 and the cladding layer 124 may be formed of Ga(In)Nasp or the like.

According to another example embodiment, the dispersion Bragg grating may be formed in the cladding layer 124 instead of in the rib waveguide 105. The dispersion Bragg grating may be formed by grating, holography or the like. The semiconductor optical device according to at least this example embodiment may output light in a single mode through the dispersion Bragg grating, and thus, may be used in WDM mode optical communication.

As described above, semiconductor optical devices according to example embodiments may include a dispersion Bragg grating on a silicon substrate or semiconductor gain layers. Semiconductor optical devices may provide a silicon-based laser capable of outputting light in a single mode. As a result, semiconductor optical devices according to example embodiments may be used in optical communication in a WDM mode or in an add/drop multiplexing mode.

In example embodiments of methods of manufacturing semiconductor optical devices, a semiconductor gain layer having a lattice constant similar to, substantially similar to, the same or substantially the same as silicon may be grown on the silicon substrate to reduce the serial resistance. As a result, a semiconductor optical device having a relatively large surface may be manufactured.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A semiconductor optical device comprising:
   a silicon substrate; and
   at least one Group III-V semiconductor gain layer formed on the silicon substrate, one of the silicon substrate and the at least one Group III-V semiconductor gain layer having a dispersion Bragg grating formed therein.

2. The semiconductor optical device of claim 1, wherein the Group III-V semiconductor gain layer includes a gain medium having the same lattice constant as the silicon substrate.

3. The semiconductor optical device of claim 2, wherein the gain medium includes Ga(In)NAsP or GaNAsP.

4. The semiconductor optical device of claim 1, wherein the Group III-V semiconductor gain layer is grown on the silicon substrate.

5. The semiconductor optical device of claim 1, wherein the dispersion Bragg grating is formed using holography or lithography.

6. The semiconductor optical device of claim 1, wherein the silicon substrate includes,
   a first silicon layer,
   an insulating layer formed on the first silicon layer, and
   a second silicon layer formed on the insulating layer.

7. The semiconductor optical device of claim 6, wherein a plurality of silicon dioxide layers are formed on the second silicon layer and a waveguide is formed between the silicon dioxide layers.

8. The semiconductor optical device of claim 7, wherein the silicon dioxide layers are formed using an ion injection method.

9. The semiconductor optical device of claim 7, wherein the dispersion Bragg grating is formed by thermal oxidization.

10. The semiconductor optical device of claim 7, wherein the dispersion Bragg grating is formed on a top surface or a lateral side of the waveguide.

11. The semiconductor optical device of claim 10, wherein the dispersion Bragg grating is formed discontinuously.

12. The semiconductor optical device of claim 1, wherein an N metal layer is formed on the semiconductor gain layer and a P metal layer is formed in the lower portion of the silicon substrate.

13. The semiconductor optical device of claim 1, wherein a P metal layer is formed on the semiconductor gain layer and an N metal layer is formed in the lower portion of the silicon substrate.

14. The semiconductor optical device of claim 1, wherein a P metal layer is formed on each lateral side of the silicon substrate using evaporation or electro-plating, and via holes are formed in the P metal layer to connect electrodes.

15. The semiconductor optical device of claim 1, wherein the silicon substrate and the semiconductor gain layer are joined.

16. A wavelength division multiplexing (VDM) system comprising:
   the semiconductor optical device of claim 1; and
   a plurality of optical modulators; wherein
      the silicon substrate includes a plurality of rib waveguides coupled to a corresponding one of the plurality of optical modulators, each of the plurality of rib waveguides including a Bragg grating formed therein,
      the at least one Group III-V semiconductor gain layer includes a plurality of Group III-V semiconductor gain layers formed on the silicon substrate, each of the plurality of Group III-V semiconductor gain layers corresponding to one of the plurality of rib waveguides, and
      each Bragg grating having a different period of grating.

17. A method of manufacturing a semiconductor optical device, the method comprising:
   forming a Group III-V semiconductor gain layer on a silicon substrate; and
   forming a dispersion Bragg grating on the silicon substrate or the semiconductor gain layer.

18. The method of claim 17, wherein the Group III-V semiconductor gain layer includes a gain medium having a lattice constant that is the same as the silicon substrate.

19. The method of claim 18, wherein the gain medium includes Ga(In)NAsP or GaNAsP.

20. The method of claim 17, wherein the dispersion Bragg grating is formed using holography or lithography.

21. The method of claim 17, further including,
   forming a first silicon layer,
   forming an insulating layer on the first silicon layer, and
   forming a second silicon layer on the insulating layer to form the silicon substrate.

22. The method of claim 21, wherein a plurality of silicon dioxide layers are formed on the second silicon layer and a waveguide is formed between the silicon dioxide layers.

23. The method of claim 22, wherein the dispersion Bragg grating is formed on a top surface or a lateral side of the waveguide.

24. The method of claim 21, wherein the silicon dioxide layers are formed using an ion injection method.

25. The method of claim 21, wherein the dispersion Bragg grating is formed by thermal oxidization.

26. The method of claim 17, wherein the dispersion Bragg grating is formed discontinuously.

27. The method of claim 17, wherein an N metal layer is formed on the semiconductor gain layer and a P metal layer is formed in the lower portion of the silicon substrate.

28. The method of claim 17, wherein a P metal layer is formed on the semiconductor gain layer and an N metal layer is formed in the lower portion of the silicon substrate.

29. The method of claim 17, wherein a P metal layer is formed on each lateral side of the silicon substrate using an evaporation or electro-plating method, and via holes are formed in the P metal layer to connect electrodes.

* * * * *